(12) United States Patent
Sun et al.

(10) Patent No.: US 10,825,881 B2
(45) Date of Patent: Nov. 3, 2020

(54) ARRAY SUBSTRATE, DISPLAY DEVICE AND PATTERN RECOGNITION METHOD THEREOF

(71) Applicant: BOE TECHNOLOGY GROUP CO., LTD., Beijing (CN)

(72) Inventors: Yanliu Sun, Beijing (CN); Hao Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 72 days.

(21) Appl. No.: 16/149,859

(22) Filed: Oct. 2, 2018

(65) Prior Publication Data
US 2019/0172887 A1    Jun. 6, 2019

(30) Foreign Application Priority Data
Dec. 5, 2017    (CN) .......................... 2017 1 1269029

(51) Int. Cl.
*G06F 3/041*    (2006.01)
*H01L 27/32*    (2006.01)
(Continued)

(52) U.S. Cl.
CPC ........ *H01L 27/3272* (2013.01); *G06K 9/0004* (2013.01); *G06K 9/209* (2013.01);
(Continued)

(58) Field of Classification Search
None
See application file for complete search history.

(56) References Cited

U.S. PATENT DOCUMENTS

| 2004/0263441 A1* | 12/2004 | Tanaka | ................... | G09G 3/325 |
| | | | | 345/76 |
| 2015/0090970 A1* | 4/2015 | Park | .................... | H01L 27/3213 |
| | | | | 257/40 |

(Continued)

FOREIGN PATENT DOCUMENTS

| CN | 102081483 A | 6/2011 |
| CN | 105184248 A | 12/2015 |

(Continued)

OTHER PUBLICATIONS

First Office Action issued in corresponding Chinese Application No. 201711269029.X, dated Nov. 21, 2019, with English translation.

(Continued)

*Primary Examiner* — Joseph R Haley
(74) *Attorney, Agent, or Firm* — McDermott Will & Emery LLP

(57) ABSTRACT

An array substrate, including a pattern recognition layer, a light-shielding layer, and a plurality of light-emitting devices. The pattern recognition layer is disposed on a side of the light-shielding layer away from the plurality of light-emitting devices. The light-shielding layer shields at least one of the multi-primary colored lights emitted by the light-emitting devices. The light-shielding layer has a plurality of imaging holes located in the display area. The orthographic projections of the plurality of imaging holes and the plurality of light-emitting devices on the plate surface of the base substrate are independent from each other. The pattern recognition layer includes a plurality of sensor units. The orthographic projections of the plurality of imaging holes on the plate surface of the base substrate are located in the orthographic projections of the plurality of sensor units on the plate surface of the base substrate in a one-to-one correspondence manner.

11 Claims, 6 Drawing Sheets

(51) Int. Cl.
G06K 9/00 (2006.01)
G06K 9/20 (2006.01)

(52) U.S. Cl.
CPC ...... *H01L 27/3234* (2013.01); *H01L 27/3246* (2013.01); *H01L 27/3258* (2013.01)

(56) References Cited

U.S. PATENT DOCUMENTS

| | | |
|---|---|---|
| 2017/0091506 A1 | 3/2017 | Sinha et al. |
| 2017/0262686 A1 | 9/2017 | Gao et al. |
| 2018/0315803 A1 | 11/2018 | Jin |
| 2019/0012555 A1* | 1/2019 | Bae .................. G06K 9/0004 |
| 2019/0056613 A1 | 2/2019 | Wang et al. |
| 2019/0156097 A1 | 5/2019 | Liu et al. |

FOREIGN PATENT DOCUMENTS

| | | | |
|---|---|---|---|
| CN | 105550664 A | 5/2016 | |
| CN | 106298859 A | 1/2017 | |
| CN | 106773219 A | 5/2017 | |
| CN | 107168465 A | 9/2017 | |
| CN | 107193412 A | 9/2017 | |

OTHER PUBLICATIONS

Second Office Action issued in corresponding Chinese Application No. 201711269029.X, dated Jun. 3, 2020, with English translation.

* cited by examiner

ARRAY SUBSTRATE, DISPLAY DEVICE AND PATTERN RECOGNITION METHOD THEREOF

CROSS-REFERENCE TO RELATED APPLICATIONS

This application claims priority to Chinese Patent Application No. 201711269029.X, submitted to the Chinese patent office on Dec. 5, 2017, titled "ARRAY SUBSTRATE, DISPLAY DEVICE AND PATTERN RECOGNITION METHOD THEREOF", which is incorporated herein by reference in its entirety.

TECHNICAL FIELD

The present disclosure relates to the technical field of fingerprint recognition, and in particular, to an array substrate, a display device and a pattern recognition method thereof.

BACKGROUND

With the continuous improvement of living standards, various terminal devices have become a necessity in life, and users also have higher and higher requirements for terminal devices.

SUMMARY

In a first aspect, the present disclosure provides an array substrate, including a pattern recognition layer, a light-shielding layer and a plurality of light-emitting devices.

the light-shielding layer and the plurality of light-emitting devices are stacked on a base substrate along a direction away from the base substrate; the pattern recognition layer is disposed on a side of the light-shielding layer away from the plurality of light-emitting devices; the light-shielding layer is configured to shield at least one of multi-primary colored lights emitted by the light-emitting devices; the light-shielding layer has a plurality of imaging holes located in a display area, the orthographic projections of the plurality of imaging holes and the plurality of light-emitting devices on a plate surface of the base substrate are independent from each other;

the pattern recognition layer comprises a plurality of sensor units that are in one-to-one correspondence with the plurality of imaging holes; the orthographic projections of the plurality of imaging holes on the plate surface of the base substrate are located in the orthographic projections of the plurality of sensor units on the plate surface of the base substrate in an one-to-one correspondence manner.

In some embodiments, the light-shielding layer comprises a planarization layer disposed between the base substrate and the plurality of light-emitting devices, or the light-shielding layer comprises a pixel defining layer including a plurality of pixel openings which are in one-to-one correspondence with the plurality of light-emitting devices, the plurality of light-emitting devices are disposed in the plurality of pixel openings in an one-to-one correspondence manner, or the light-shielding layer comprises a planarization layer and a pixel defining layer which are stacked together, and the planarization layer is located between the pixel defining layer and the base substrate.

In some embodiments, the light-shielding layer is configured to shield visible light.

In some embodiments, the material of the light-shielding layer comprises polyimide and a light-absorbing substance doped in the polyimide, and the light-shielding layer is configured to shield blue light and green light.

In some embodiments, a mass ratio of the light-absorbing substance to the polyimide is (10~45): (55~90).

In some embodiments, the array substrate further comprises a green light filter or a blue light filter disposed between the light-shielding layer and the pattern recognition layer.

In some embodiments, the material of the light-shielding layer is an organic material with an optical density value in the range from 2.0 to 10.0, and the thickness thereof is from 3 µm to 4 µm.

In some embodiments, the plurality of imaging holes are distributed evenly in the display area; or the display area has a pattern recognition portion, and the plurality of imaging holes are distributed evenly in a region of the light-shielding layer corresponding to the pattern recognition portion.

In some embodiments, each of the plurality of imaging holes is a circular hole.

In some embodiments, each of the plurality of imaging holes has a diameter from 5 µm to 10 µm.

In a second aspect, the present disclosure provides a display device, comprising the array substrate described above.

In a third aspect, the present disclosure provides a pattern recognition method, which is used in the display device described above. The pattern recognition method comprises:

controlling the light-emitting devices to emit light;

performing pattern recognition according to an electrical signal converted from a light signal detected by the sensor units.

In some embodiments, the light-shielding layer of the array substrate included in the display device is configured to shield blue light and green light:

the controlling the light-emitting devices to emit light comprising:

controlling the light-emitting device configured to emit green light to emit light and/or controlling the light-emitting device configured to emit blue light to emit light.

BRIEF DESCRIPTION OF THE DRAWINGS

In order to illustrate more clearly the technical solutions in the embodiments of the present disclosure or the related art, the drawings to be used in the description of the embodiments or the related art will be briefly described below. Obviously, the drawings in the following description are merely some embodiments of the present disclosure. For a person with ordinary skill in the art, other drawings can be obtained according to these drawings without paying any creative effort.

DETAILED DESCRIPTION

The technical solutions in the embodiments of the present disclosure will be described clearly and completely below with reference to the accompanying drawings in the embodiments of the present disclosure. Obviously, the described embodiments are merely some but not all of embodiments of the present disclosure. All other embodiments obtained by a person ordinarily skilled in the art based on the embodiments of the present disclosure without paying any creative effort shall be included in the protection scope of the present disclosure.

In the related art, biological patterns, such as fingerprint patterns and palm patterns have a feature of individual uniqueness, so that pattern recognition has an excellent function of privacy protection. Therefore, pattern recognition is widely applied to various terminal devices to improve user experience and security of terminal devices. However, in a related display device, a pattern recognition device is disposed on the bezel position of the display device, which is not only disadvantageous for realizing a narrow bezel, but affects the appearance of the display device.

Some embodiments of the present disclosure provide an array substrate, a display device and a pattern recognition method thereof. The array substrate, the display device and the pattern recognition method thereof can realize fingerprint pattern recognition in the display area of the display device, which is advantageous for the display device to realize a narrow bezel.

Figure 1A:
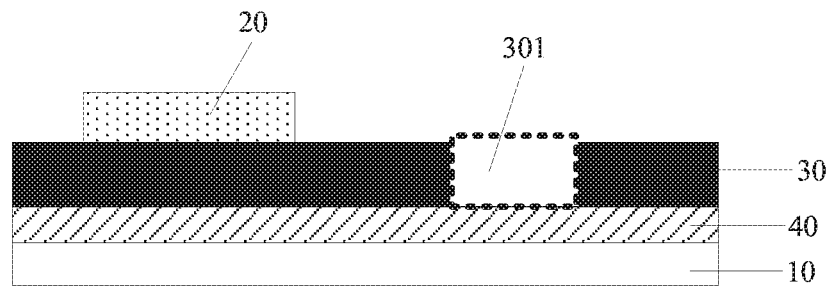
FIG. 1(a) is a schematic structural diagram 1 of an array substrate provided in some embodiments of the present disclosure.
Figure 1B:
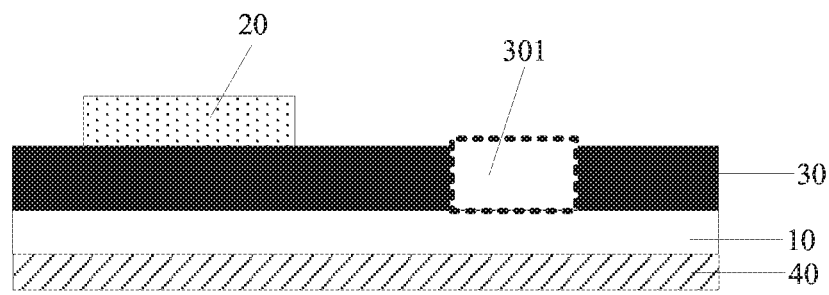
FIG. 1(b) is a schematic structural diagram 2 of an array substrate provided in some embodiments of the present disclosure.

An array substrate 1 provided in some embodiments of the present disclosure. The array substrate is used in a display device 2 having an integrated pattern recognition structure. As shown in FIG. 1(a) and FIG. 1(b), the array substrate comprises a plurality of light-emitting devices 20.

The plurality of light-emitting devices 20 are disposed on a base substrate 10. The array substrate further comprises a pattern recognition layer 40 and a light-shielding layer 30. The light-shielding layer 30 and the plurality of light-emitting devices 20 are stacked on the base substrate 10 along a direction away from the base substrate 10. The pattern recognition layer 40 described above (equivalent to the pattern recognition structure) is disposed on a side of the ht-shielding layer 30 away from the plurality of light-emitting devices 20.

As shown in FIG. 2(a), FIG. 2(b), FIG. 10 and FIG. 11, the plurality of light-emitting devices 20 are located in a display area AA. The light-shielding layer 30 is configured to shield at least one of multi-primary colored lights emitted by the light-emitting devices 20. The light-shielding layer 30 has a plurality of imaging holes 301 located in the display area AA. The orthographic projections of the plurality of imaging holes 301 and the plurality of light-emitting devices 20 on the plate surface of the base substrate 10 do not overlap each other, so that the orthographic projections of the plurality of imaging holes 301 and the plurality of light-emitting devices 20 on the base substrate 10 are independent from each other. The pattern recognition layer 40 described above comprises a plurality of sensor units 410 which are in one-to-one correspondence with the plurality of imaging holes 301. The orthographic projections of the plurality of imaging holes 301 on the plate surface of the base substrate 10 are located in the orthographic projections of the plurality of the sensor units on the plate surface of the base substrate in a one-to-one correspondence manner.

At this time, the lights emitted by at least one of the light-emitting devices 20 around one imaging hole 301 may irradiate to the corresponding sensor unit 410 through the one imaging hole 301 after being reflected by a to-be-recognized body REC located at a display side of the display device 2.

As shown in FIG. 1 (a)~FIG. 2(b), FIG. 10 and FIG. 11, the principle for realizing pattern recognition of the array substrate 1 described above is as follows: the lights emitted by the light-emitting devices 20 irradiate towards the pattern recognition layer 40 after being reflected by the to-be-recognized body REC at the display side of the display device 2. Since at least one of the multi-primary colored lights emitted by the light-emitting devices 20 is shielded by the light-shielding layer 30, so that the primary colored light(s) shielded by the light-shielding layer 30 can only irradiate to the pattern recognition layer 40 through the imaging holes 301 on the light-shielding layer 30. When at least one of the multi-primary colored lights emitted by the light-emitting devices 20 transmits the light-shielding layer 30, at least one of the primary colored lights transmitting the light-shielding layer 30 further irradiates to the pattern recognition layer 40 through the imaging hole 301, which makes the pattern recognition layer difficult to recognize the to-be-recognized body REC through at least one of the primary colored lights transmitting the light-shielding layer. After irradiating to the to-be-recognized body REC, the primary colored light shielded by the light-shielding layer 30 may irradiate to the pattern recognition layer 40 only through the imaging holes 301 after being reflected by the to-be-recognized body REC, and it is difficult for the pattern recognition layer to recognize the to-be-recognized body REC through at least one of the primary colored lights transmitting the light-shielding layer. Therefore, the to-be-recognized body REC can only be imaged on the pattern recognition layer 40 using the primary colored light shielded by the light-shielding layer 30, thereby recognizing the image of the to-be-recognized body REC using the pattern recognition layer 40, so as to obtain the pattern of the to-be-recognized body REC to achieve the purpose of pattern recognition.

In some embodiments, as shown in FIG. 1(a)~FIG. 2(b), the type of the plurality of light-emitting devices 20 described above is not limited. The plurality of light-emitting devices 20 may be an OLED (Organic Light-Emitting Diode) light-emitting device, or a QLED (Quantum Dot Light-Emitting Diodes) light-emitting device or the like.

Figure 3:
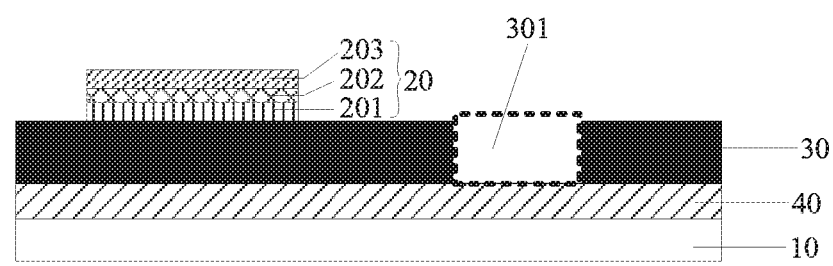
FIG. 3 is a schematic structural diagram 3 of an array substrate provided in embodiments of the present disclosure.

As shown in FIG. 3, when each of the light-emitting devices 20 is an OLED or a QLED light-emitting device, each of the light-emitting devices 20 comprises an anode 201, a cathode 203 and a light-emitting layer 202 disposed between the anode 201 and the cathode 203. Each of the light-emitting devices 20 may also comprise at least one of a hole injection layer, a hole transport layer, an electron injection layer and an electron transport layer disposed between the anode 201 and the cathode 203.

In some embodiments, as shown in FIG. 1(a)~FIG. 2(b), the color of light emitted by each of the light-emitting devices 20 is not limited. Each of the light-emitting devices 20 may emit white light, as well as any one of the multi-primary colored lights. For example, each of the light-emitting devices 20 may emit red light, green light or blue light. For another example, each of the light-emitting devices 20 may emit yellow light, magenta light or cyan light.

In some embodiments, as shown in FIG. 1(a)~FIG. 2(b), the light-shielding layer 30 may shield all of the lights emitted by each of the light-emitting devices 20. In other words, the light-shielding layer 30 may be configured to shield visible light, or configured to shield at least one of the multi-primary colored lights emitted by each of the light-emitting devices 20.

Illustratively, the plurality of light-emitting devices 20 described above are configured to emit red light, green light or blue light. The light-shielding layer 30 may be configured to shield red light, green light and blue light, or configured to shield merely green light and blue light.

As shown in FIG. 1(a)~FIG. 2(b), the primary colored lights shielded by the light-shielding layer 30 can only transmits the light-shielding layer 30 through the imaging holes 30 on the light-shielding layer 30, so that the primary colored lights that are not shielded by the light-shielding layer 30 may not only pass through the imaging holes 301, but also transmit the light-shielding layer 30. Thus, the pattern recognition layer 40 is impossible to recognize the to-be-recognized body REC using the primary colored lights that are not shielded by the light-shielding layer 30. The primary colored light shielded by the light-shielding layer 30 can be recognized by the pattern recognition layer 40 after passing through the imaging holes 301 upon irradiating to and reflected by the to-be-recognized body REC. Therefore, the primary colored light shielded by the light-shielding layer 30 may be used by the pattern recognition layer 40 to recognize the to-be-recognized body REC.

On this basis, the light-shielding layer 30 described above may be an inherent film layer of the array substrate 1, or an extra film layer disposed separately.

In some embodiments, as shown in FIG. 1(a)~FIG. 2(b) and FIG. 10, the number of the imaging holes 301 disposed on the light-shielding layer 30 is not limited. The number of the imaging holes 301 may be set according to needs, which may be the same as or different from the number of the light-emitting devices 20. When they are different, the number of the imaging holes 301 is less than the number of the light-emitting devices 20.

The section shape of each of the imaging holes 301 along the radial direction of the imaging hole is not limited. For example, the section shape of each of the imaging holes 301 along the radial direction of the imaging hole may be a rectangle, a circle, a triangle or the like. Each of the imaging holes 301 may be centrosymmetric.

When the section shape of each of the imaging holes 301 along the radial direction of the imaging hole is a circle, each of the imaging holes 301 is a circular hole. At this time, the diameter of each of the imaging holes 301 should be set by the standard that the pattern of the to-be-recognized body REC can be imaged. When the diameter of each of the imaging holes 301 is from 5 μm to 10 μm, the pattern of the to-be-recognized body REC can be imaged.

Illustratively, the pattern of the to-be-recognized body REC can be imaged when the diameter of each of the imaging holes 301 is 5 μm, 7 μm or 8 μm. In some embodiments, as shown in FIG. 1(a)~FIG. 2(b) and FIG. 10, the number of the sensor units 410 included in the pattern recognition layer 40 is not limited. One imaging hole 301 may be in correspondence with one sensor unit or a plurality of sensor units 410 included in the pattern recognition layer 40, alternatively, one sensor unit 410 included in the pattern recognition layer 40 may be in correspondence with a plurality of imaging holes 301.

In some embodiments, the to-be-recognized body REC may be a finger, a palm, a toe or a sole, which is not limited.

Figure 2A:
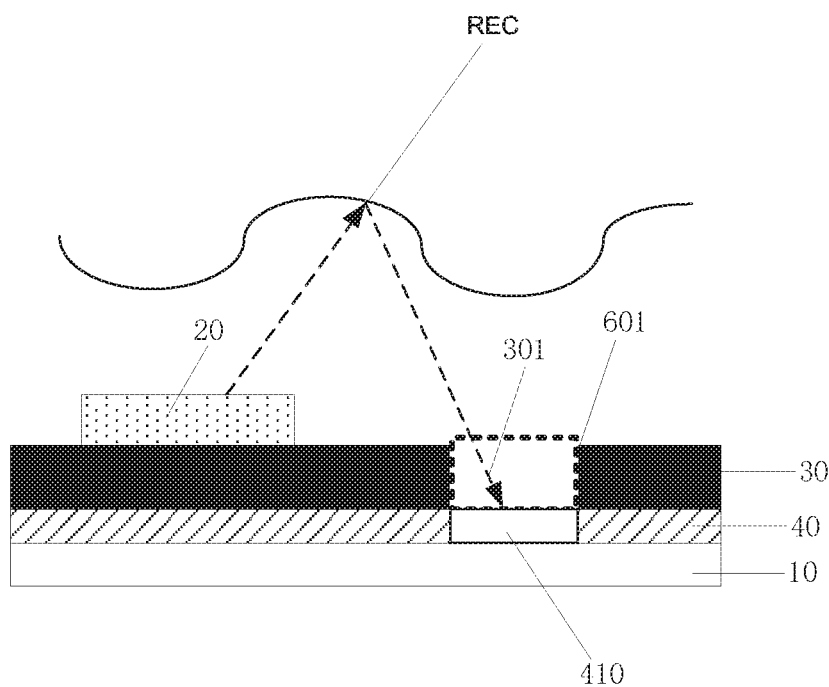
FIG. 2(a) is a schematic diagram 1 showing the pattern recognition principle of an array substrate provided in some embodiments of the present disclosure.
Figure 2B:
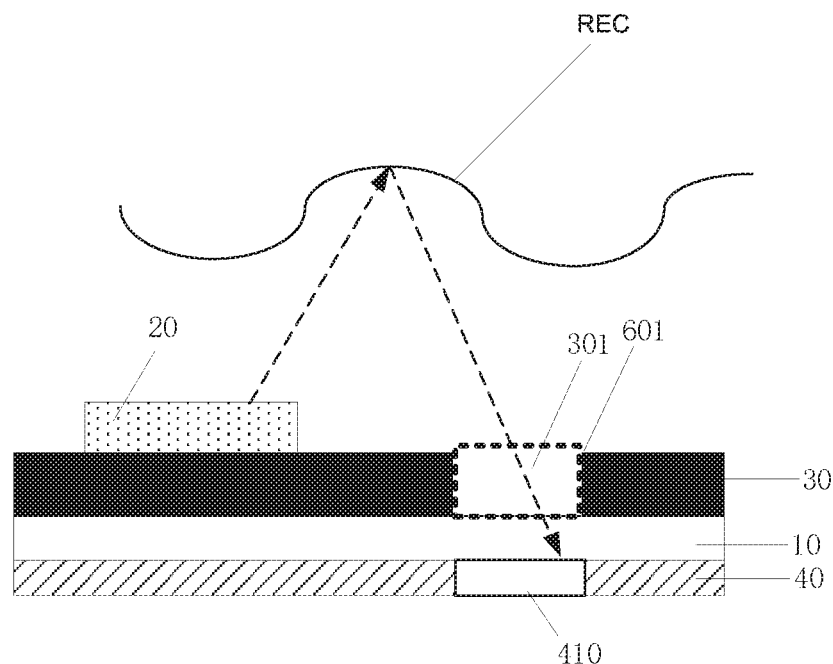
FIG. 2(b) is a schematic diagram 2 showing the pattern recognition principle of an array substrate provided in some embodiments of the present disclosure.

In some embodiments, the pattern recognition layer 40 may be disposed on a side of the base substrate 10 close to the light-shielding layer 30 as shown in FIG. 1(a) and FIG. 2(a), or disposed on a side of the base substrate 10 away from the light-shielding layer 30 as shown in FIG. 1(b) and FIG. 2(b).

As shown in FIG. 1(a)~FIG. 2(b), the array substrate 1 provided in some embodiments of the present disclosure is applied to a display device 2 having an integrated pattern recognition structure. The array substrate 1 comprises a light-shielding layer 30 and a plurality of light-emitting devices 20. Since the light-shielding layer 30 is configured to shield at least one of the multi-primary colored lights emitted by at least one of the light-emitting devices 20, after the primary colored light shielded by the light-shielding layer irradiate to the to-be-recognized body REC, it can only irradiate to the pattern recognition layer 40 through the imaging holes 301 on the light-shielding layer 30 after being reflected by the to-be-recognized body REC, and then form images on the pattern recognition layer 40, so that the images formed by the to-be-recognized body REC are detected by the pattern recognition layer 40; thereby the pattern of the to-be-recognized body REC can be recognized. Since the plurality of light-emitting devices 20 and the imaging holes 301 on the light-shielding layer 30 are all disposed in the display area AA, a display device 2 having an integrated pattern recognition structure can recognize the pattern in the display area AA while implementing display when the array substrate 1 is applied to the display device 2. Thus, the pattern recognition layer acting as the pattern recognition structure would not occupy the bezel position BM of the display device 2. Therefore, applying the array substrate 1 to the display device 2 having an integrated pattern recognition structure is advantageous for producing a narrow bezel of the display device 2.

Figure 4:
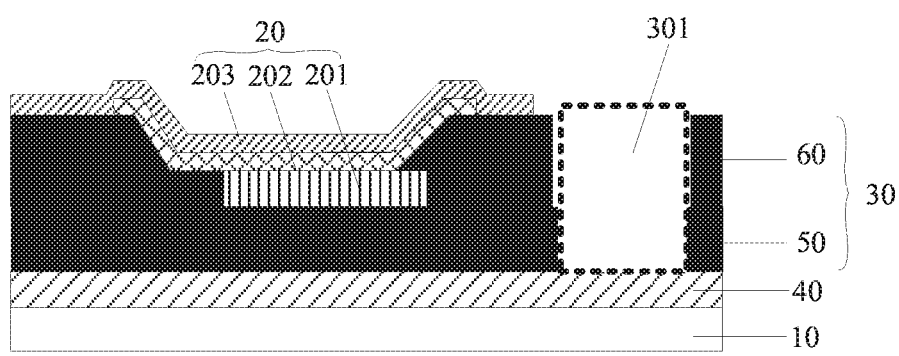
FIG. 4 is a schematic structural diagram 4 of an array substrate provided in some embodiments of the present disclosure.

In some embodiments, as shown in FIG. 4, the light-shielding layer 30 described above comprises a planarization layer 50 (called PLN for short) and/or a pixel defining layer 60 (called PDL for short).

When the light-shielding layer described above comprises a planarization layer 50, the planarization layer 50 is disposed between the base substrate 10 and the plurality of light-emitting devices 20. At this time, the planarization layer 50 is configured to be used as the light-shielding layer 30. The material of the planarization layer 50 is a light-shielding material that can form the planarization layer 50. When the material of the planarization layer 50 is a light-shielding flat material, the planarization layer 50 may play roles of both flattening and light shielding.

When the light-shielding layer described above comprises a pixel defining layer 60, the pixel defining layer 60 is configured to space the plurality of light-emitting devices 20. At this time, the pixel defining layer 60 is configured to be used as the light-shielding layer 30. The pixel defining layer 60 is a light-shielding material that can be form the pixel defining layer. When the pixel defining layer 60 is a light-shielding material that can be produced into the pixel defining layer, the pixel defining layer 60 may play roles of both pixel defining and light shielding.

Illustratively, as shown in FIG. 2(a) and FIG. 2(b), the pixel defining layer 60 comprises a plurality of pixel openings 601 which are in one-to-one correspondence with the plurality of light-emitting devices, and the plurality of light-emitting devices 20 are disposed in the plurality of pixel openings 601 in a one-to-one correspondence manner.

When the light-shielding layer comprises a planarization layer 50 and a pixel defining layer 60, the planarization layer 50 is located between the pixel defining layer 60 and the base substrate 10. Both the planarization layer 50 and the pixel defining layer 60 are configured to be used as the light-shielding layer. At this time, the material of the planarization layer 50 is a light-shielding material that can be produced into the planarization layer 50. The pixel defining layer 60 is a light-shielding material that can be produced into the pixel defining layer. The planarization layer 50 and the pixel defining layer 60 can also play a role of light shielding while exerting their respective functions.

When the light-shielding layer 30 described above comprises a planarization layer 50 and/or a pixel defining layer 60, imaging holes 301 can be formed on the planarization layer 50 and/or the pixel defining layer 60 in an exposure development process after the planarization layer 50 and/or the pixel defining layer 60 are formed.

Illustratively, as shown in FIG. 1(a)~FIG. 2(b) and FIG. 9, when the light-shielding layer 30 comprises a planarization layer 50 and a pixel defining layer 60, a first imaging hole 3011 may be formed on the planarization layer 50 in an exposure development process after the planarization layer 50 is formed, and a second imaging hole 3012 may be formed on the pixel defining layer 60 in an exposure development process after the pixel defining layer 60 is formed. The first imaging hole 3011 and the second imaging hole 3012 constitute the imaging holes 301. Alternatively, the planarization layer 50 and the pixel defining layer 60 are subjected to an exposure development process after both of them are formed, so as to form a first imaging hole 3011 on the planarization layer 50 and form a second imaging hole 3012 on the pixel defining layer 60 at the same time, so that the first imaging hole 3011 and the second imaging hole 3012 constitute the imaging holes 301.

In the related art, the material of the planarization layer and the pixel defining layer is usually a transparent material. Because the light-shielding layer 30 comprises the planarization layer 50 and/or the pixel defining layer 60, the material of them cannot be a transparent material, and should be a light-shielding material that may shield at least one of the multi-primary colored lights.

Figure 5:
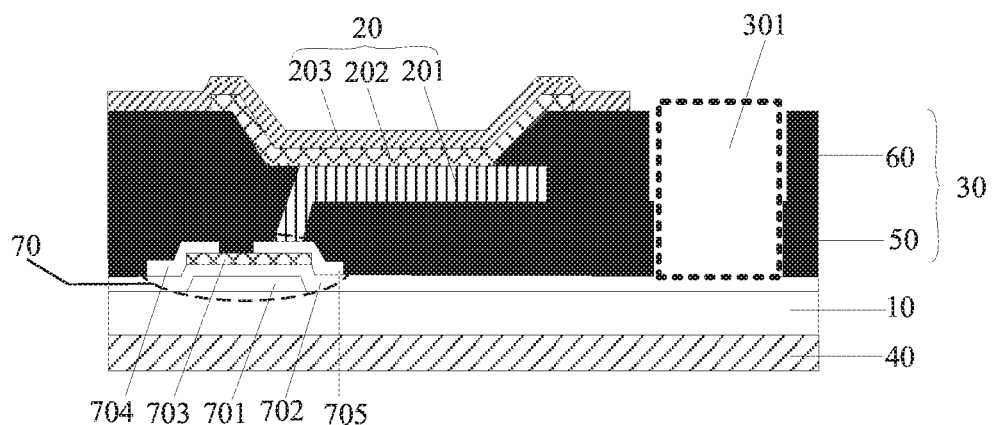
FIG. 5 is a schematic structural diagram 5 of an array substrate provided in some embodiments of the present disclosure.

In some embodiments, as shown in FIG. 5, the array substrate 1 described above further comprises a film transistor 70. The film transistor 70 comprises a gate 701, a gate insulation layer 702, an active layer 703, a source electrode 704 and a drain electrode 705.

Figure 6:
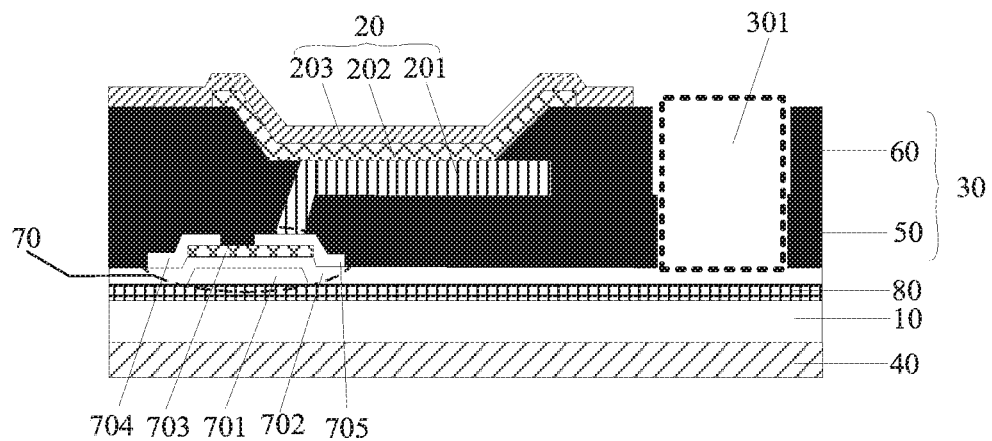
FIG. 6 is a schematic structural diagram 6 of an array substrate provided in some embodiments of the present disclosure.

A plurality of film transistors are provided, and the plurality of film transistors are in one-to-one correspondence with the plurality of the light-emitting devices. The drain electrode 705 of the film transistor 70 is electrically connected with the anode 201 of the corresponding light-emitting device 20. The planarization layer 50 is disposed on the surface of the film transistor 70 away from the array substrate 1. On this basis, as shown in FIG. 6, the array substrate 1 may further comprise a buffer layer 80 or other film layers between the base substrate 10 and the film transistor 70, which will not be elaborated here.

When the light-shielding layer 30 comprises a planarization layer 50 and/or a pixel defining layer 60, the planarization layer 50 and/or the pixel defining layer 60 may function as the light-shielding layer 30, so that the array substrate 1 does not need to be separately provided with the light-shielding layer 30. Therefore, when the light-shielding layer 30 comprises a planarization layer 50 and/or a pixel defining layer 60, on the one hand, the fabrication process of the array substrate 1 is simplified, and on the other hand, the thickness of the array substrate 1 is reduced, which is advantageous for making the display device 2 light and thin.

The light-shielding layer 30 described above may further comprises other original film layers on the array substrate 1 in addition to the planarization layer 50 and/or the pixel defining layer 60. Illustratively, the light-shielding layer 30 further comprises an insulation layer on the array substrate.

In some embodiments, as shown in FIG. 1(a)~FIG. 2(b), the light-shielding layer 30 is configured to shield at least one of the multi-primary colored lights emitted by the light-emitting devices 20. When the light-shielding layer 30 cannot shield all of the various lights emitted by the light-emitting devices 20, the primary colored light that is not shielded by the light-shielding layer 30 directly transmits the light-shielding layer 30, so that the primary colored light that is not shielded by the light-shielding layer 30 cannot form images on the pattern recognition layer 40 after irradiating to and then being reflected by the to-be-recognized body REC; while the primary colored light shielded by the light-shielding layer 30 can image the pattern of the to-be-recognized body REC on the pattern recognition layer 40 after passing through the imaging holes 301 on the light-shielding layer 30 upon reflection by the to-be-recognized body REC. Therefore, that the primary colored light that is not shielded and irradiating to the pattern recognition layer 40 may influence the images formed by the shielded primary colored light on the pattern recognition layer 40. On this basis, the light-shielding layer 30 is configured to shield visible light. In other words, the light-shielding layer 30 is configured to shield all lights emitted by the light-emitting devices 20, in this way, the lights emitted by the light-emitting devices 20 can only irradiate to the pattern recognition layer 40 through the imaging holes 301, so that the lights passing through the imaging holes 301 may form images, thereby ensuring that the multi-primary colored lights emitted by the light-emitting devices 20 may form images on the pattern recognition layer 40 through the imaging holes 301 after irradiating to and then being reflected by the to-be-recognized body REC. Therefore, when the light-shielding layer 30 is configured to shield all lights emitted by the light-emitting devices 20, the pattern image of the pattern of the to-be-recognized body REC will be clearer, which will increase the pattern recognition accuracy of the pattern recognition structure.

In some embodiments, the material of the light-shielding layer 30 comprises polyimide and a light-absorbing substance doped into the polyimide, the light-shielding layer can shield blue light and green light. The specific material of the light-absorbing substance is not limited. For example, the light-absorbing substance may be graphene, carbon black or a black organic material or the like. On this basis, the doping ratio of the light-absorbing substance in the polyimide is not limited, and may be set according to needs.

Illustratively, the mass ratio of the light-absorbing substance to polyimide is (10~65): (35-90). For example, the mass ratio of the light-absorbing substance to polyimide is 65:35, 20:80, 45:65 or 10:90.

In some embodiments, as shown in FIG. 1(a)~FIG. 2(b), the material of the light-shielding layer 30 is an organic material with an optical density value in the range from 2.0 to 10.0. The thickness of the light-shielding layer 30 is from 3 μm to 4 μm.

When the material of the light-shielding layer 30 is an organic material with an optical density value in the range from 2.0 to 10.0 and the thickness of the light-shielding layer 30 is from 3 μm to 4 μm, it can be ensured that lights irradiate to the pattern recognition layer 4 from the imaging holes 301 and little light is transmitted from other parts of the light-shielding layer 30, thus further reducing stray lights irradiating to the pattern recognition layer 40. Because the light-shielding layer 40 may reduce stray lights irradiating to the pattern recognition layer 40 when the material of the light-shielding layer 30 is an organic material with an optical density value in the range from 2.0 to 10.0 and the thickness of the light-shielding layer 30 is from 3 μm to 4 μm, the light-shielding layer 30 is helpful in improving the pattern recognition accuracy when the material of the light-shielding layer 30 is an organic material with an optical density value in the range from 2.0 to 10.0 and the thickness of the light-shielding layer 30 is from 3 μm to 4 μm.

Illustratively, the optical density value of the material of the light-shielding layer 30 is 2.0 when the thickness of the light-shielding layer is 3 μm. The optical density value of the material of the light-shielding layer 30 is 4.0 when the thickness of the ht-shielding layer is 3.2 μm. The optical density value of the material of the light-shielding layer 30 is 10.0 when the thickness of the light-shielding layer is 4 μm.

Figure 7:
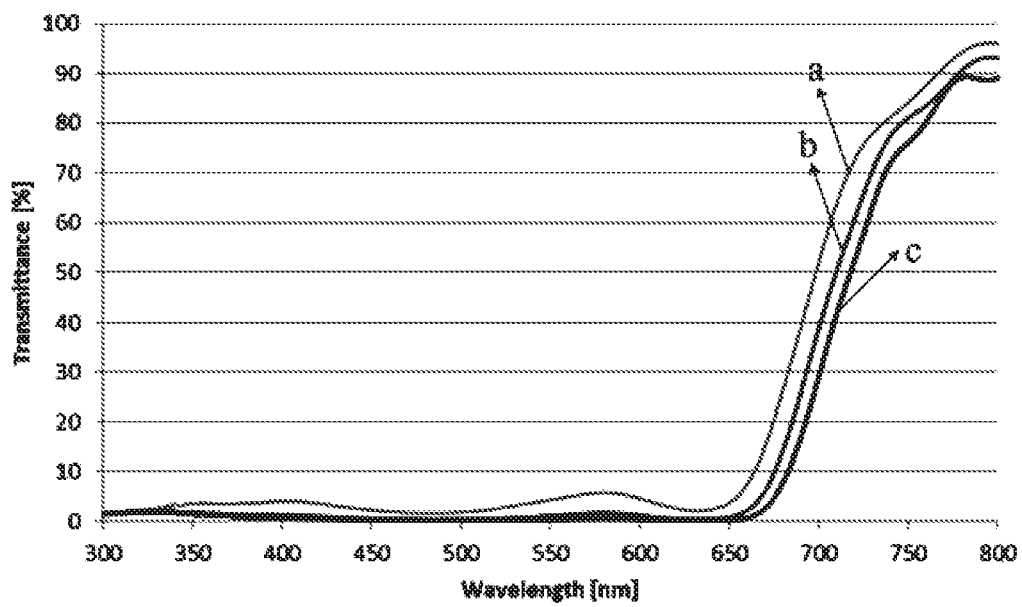
FIG. 7 is a schematic diagram showing absorption spectrum of light-shielding layers with various thickness provided in some embodiments of the present disclosure.

FIG. 7 is a schematic diagram of absorption spectrum of the light-shielding layers 30 with various thicknesses when the optical density value of the light-shielding layer is 2.0. Line a in FIG. 7 is an absorption spectrum curve of the light-shielding layer 30 with a thickness of 2 μm. Line b in FIG. 7 is an absorption spectrum curve of the light-shielding layer 30 with a thickness of 3 μm. Line c in FIG. 7 is an absorption spectrum curve of the light-shielding layer 30 with a thickness of 4 μm.

Figure 8A:
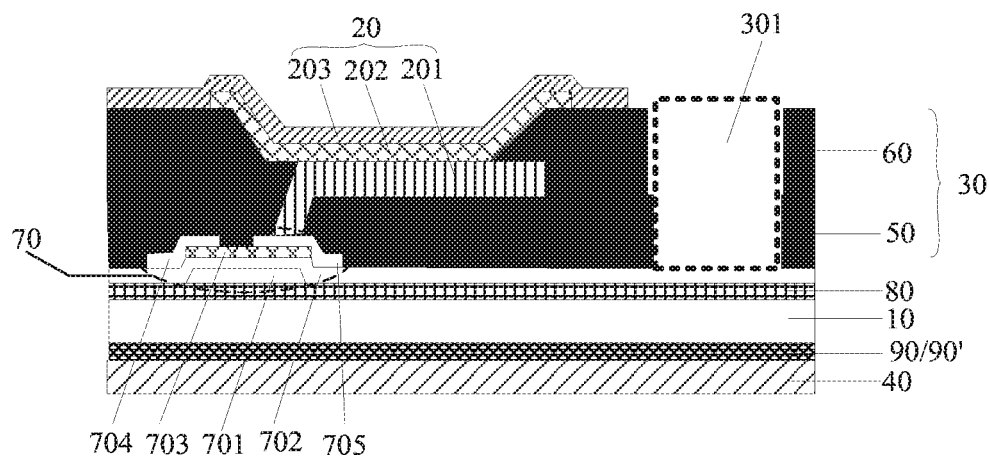
FIG. 8(a) is a schematic structural diagram 7 of an array substrate provided in some embodiments of the present disclosure.
Figure 8B:
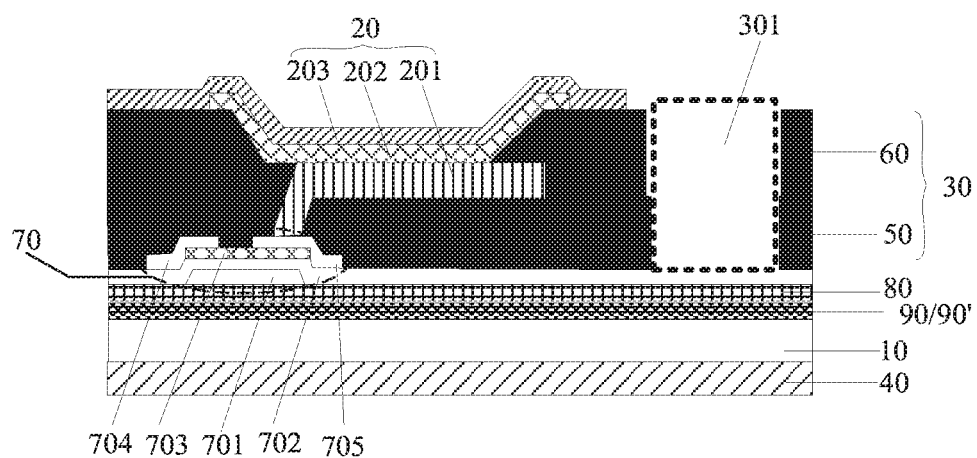
FIG. 8(b) is a schematic structural diagram 8 of an array substrate provided in some embodiments of the present disclosure.
Figure 9:
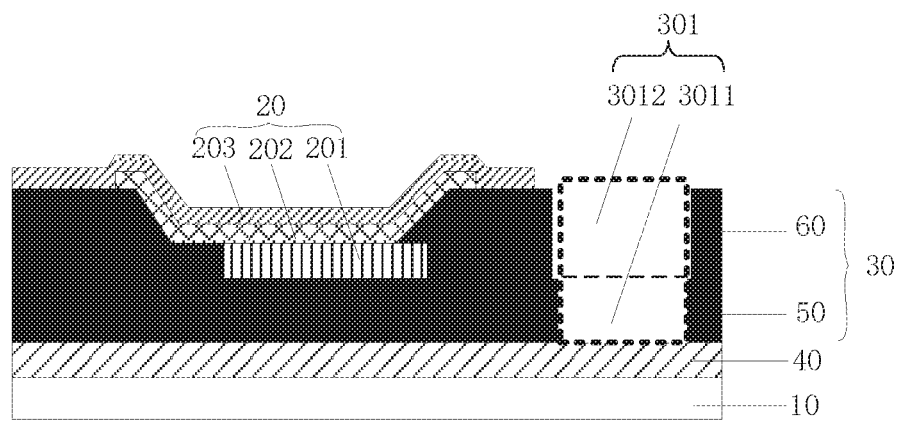
FIG. 9 is a schematic structural diagram 9 of an array substrate provided in some embodiments of the present disclosure.

From Lines a~c in FIG. 7, it can be seen that the material of the light-shielding layer 30 has a large absorption rate in the blue light band and the green light band (short wave band) and a large light transmittance in the red light band (long wave band), and the greater the thickness of the light-shielding layer 30 is, the larger the absorption rate of the light-shielding layer 30 to the blue light band and the green light band is. It can be seen from this that, when the material of the light-shielding layer 30 comprises polyimide and a light-absorbing substance doped into the polyimide such as graphene, since the light-shielding layer 30 may shield blue light and green light, the blue light and the green light may irradiate to and be reflected by the to-be-recognized body REC. As a result, the blue light and the green light reflected by the to-be-recognized body REC pass through the imaging holes 301 on the light-shielding layer 30 to image the pattern of the to-be-recognized body REC on the pattern recognition layer 40. Since the pattern of the to-be-recognized body REC is imaged on the pattern recognition layer 40, the pattern recognition layer 40 may perform pattern recognition by detecting the images of the to-be-recognized body REC. In addition, since the light-shielding layer 30 may shield blue light and green light, other primary colored lights except blue light and green light emitted by the light-emitting devices 20 may transmit the light-shielding layer 30 and irradiate to the pattern recognition layer 40. However, theses stray lights irradiating to the pattern recognition layer 40 may influence pattern image of the to-be-recognized body REC. On this basis, as shown in FIG. 8(a) and FIG. 8(b), the array substrate 1 further comprises a green light filter 90 or a blue light filter 90'. The green light filter 90 or the blue light filter 90' is disposed between the light-shielding layer 30 and the pattern recognition layer 40.

The position for disposing the green light filter 90 or the blue light filter 90' is not limited. For example, the green light filter 90 or the blue light filter 90' may be disposed on a side of the base substrate 10 away from the light-shielding layer 30 as shown in FIG. 8(a), or disposed on a side of the base substrate 10 close to the light-shielding layer 30 as shown in FIG. 8(b).

In addition, the green light filter 90 (or the blue light filter 90') and the pattern recognition layer 40 may be disposed on a same side of the base substrate 10, or disposed on two opposite sides of the base substrate 10.

Illustratively, a green light filter 90 may be disposed between the light-shielding layer 30 and the pattern recognition layer 40, so that only green light can irradiate to the pattern recognition layer 40. Also, a blue light filter 90 may be disposed between the light-shielding layer 30 and the pattern recognition layer 40, so that only blue light can irradiate to the pattern recognition layer 40.

As shown in FIG. 1(a)~FIG. 2(b), FIG. 8(a) and FIG. 8(b), since a green light filter 90 or a blue light filter 90' is disposed between the light-shielding layer 30 and the pattern recognition layer 40, only blue light or green light can irradiate to the pattern recognition layer 40 while all of other primary colored lights may be filtered by the green light filter 90 or the blue light filter 90'. Thus, disposing a green light filter 90 or a blue light filter 90' between the light-shielding layer 30 and the pattern recognition layer 40 may eliminate stray lights transmitting the light-shielding layer 30 to ensure clear images of the to-be-recognized body REC on the pattern recognition layer 40. Thereby, the pattern recognition accuracy is improved.

Figure 10:
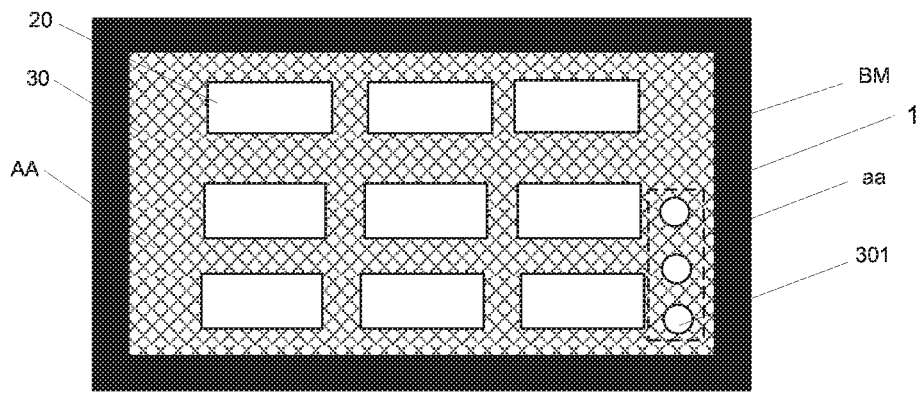
FIG. 10 is a schematic structural diagram 10 of an array substrate provided in some embodiments of the present disclosure.

As shown in FIG. 10, in some embodiments, the plurality of imaging holes 301 are distributed evenly in the whole display area AA; in this case, pattern recognition can be performed in the entire display area AA.

In some other embodiments, as shown in FIG. 10, when the display area AA has a pattern recognition portion aa and the plurality of imaging holes 301 are distributed evenly in the region of the light-shielding layer corresponding to the pattern recognition portion aa, the pattern recognition portion aa may perform pattern recognition. The size and the position of the pattern recognition portion aa are not limited, and may be set according to needs. For example, the pattern recognition portion aa may be disposed in the lower right of the display area AA.

Figure 11:
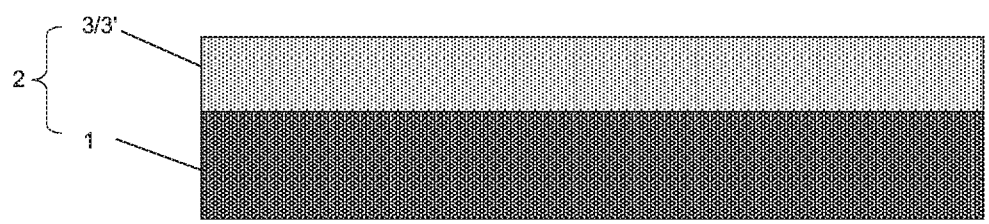
FIG. 11 is a schematic structural diagram of a display device provided in some embodiments of the present disclosure.
Figure 12:
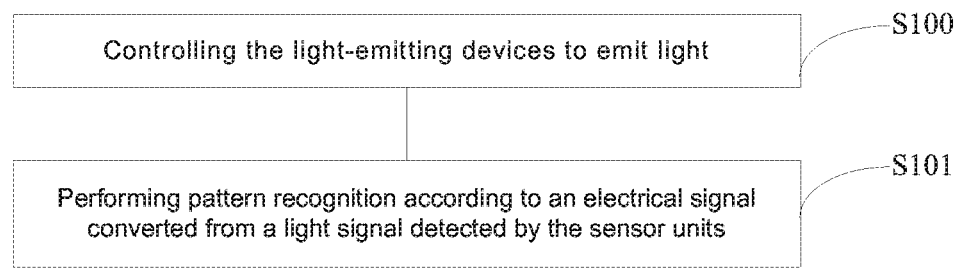
FIG. 12 is a schematic flow diagram of a pattern recognition method provided in some embodiments of the present disclosure.

In some embodiments, as shown in FIG. 11, the present disclosure provides a display device 2. The display device 2 comprises the array substrate 1 described above. In some embodiment, as shown in FIG. 10, in addition to the array substrate 1, the display device 2 may further comprise an encapsulating film layer 3 or a package cover 3' paired with the array substrate 1.

In some embodiments, the display device 2 may display various pictures, including moving pictures (e.g. videos) and/or fixed pictures (e.g. still images). The content of these pictures may be either text images or drawings.

In some embodiments, it is expected that the described embodiments can be implemented in or associated with a variety of electronic devices. The various electronic devices may be such as, but not limited to, mobile phones, wireless devices, personal data assistants (PDAs), handheld or portable computers, GPS receivers/navigators, cameras, MP4 video players, video cameras, game consoles, watches, clocks, calculators, television monitors, flat panel displays, computer monitors, car displays (e.g. odometer displays, etc.), navigators, cockpit controls and/or displays, monitors of camera views (e.g. rear view camera displays in vehicles), electronic photos, electronic billboards or signboards, projectors, building structures, packages, and aesthetic structures (e.g. display devices for an image of a piece of jewelry). Further, the display device 2 described above may also be a display panel.

As shown in FIG. 1(a)~FIG. 2(b), FIG. 10 and FIG. 11, some embodiments of the present disclosure further provide another display device 2. The array substrate 1 of the display device 2 comprises a light-shielding layer 30 and light-emitting devices 20. The light-shielding layer 30 may shield at least one of the multi-primary colored lights emitted by the light-emitting devices 20, so that the primary colored light shielded by the light-shielding layer can only irradiate to the pattern recognition layer 40 through the imaging holes 301 on the light-shielding layer 30 after irradiating to and then being reflected by the to-be-recognized body REC, thus ensuring that the to-be-recognized body REC may be imaged on the pattern recognition layer 40. Since the to-be-recognized body REC may be imaged on the pattern recognition layer 40, the pattern recognition layer 40 may implement pattern recognition by detecting the images of the to-be-recognized body REC. Since the light-emitting devices 20 and the imaging holes 301 disposed on the light-shielding layer 30 are all disposed in the display area AA, the display device 2 may implement pattern recognition while realizing display. Thus, the pattern recognition layer 40 would not occupy the bezel position BM of the display device 2, which is beneficial for producing a narrow bezel.

As shown in FIG. 1(a)~FIG. 2(b) and FIG. 12, some embodiments of the present disclosure further provide a pattern recognition method. The pattern recognition method is used in the display device 2 described above. As shown in FIG. 8, the pattern recognition method comprises:

S100: Controlling the pattern recognition devices 20 to emit light; S101: Performing pattern recognition according to an electrical signal converted from a light signal detected by the sensor units.

As shown in FIG. 1(a)~FIG. 2(b), FIG. 11 and FIG. 12, the present disclosure provides a pattern recognition method. As the array substrate 1 of the display device 2 comprises the light-shielding layer 30 and light-emitting devices 20, the light-shielding layer 30 may shield at least one of the multi-primary colored lights emitted by the light-emitting devices 20, in this way, the shielded primary colored light(s) can only irradiate to the pattern recognition layer 40 through the imaging holes 301 on the light-shielding layer 30 after irradiating to and then being reflected by the to-be-recognized body REC, thereby forming images on the pattern recognition layer 40. And the sensor units 410 on the pattern recognition layer 40 detect the images formed by the to-be-recognized body REC to realize the pattern recognition. Since all of the light-emitting devices 20 and the imaging holes 301 on the light-shielding layer 30 in the embodiments of the present disclosure are disposed in the display area AA, the pattern recognition may be implemented in the display area AA while displaying is realized. Thus, the bezel position BM of the display device 2 would not be occupied, which is beneficial for producing a narrow bezel.

In some embodiments, as shown in FIG. 1(a)~FIG. 2(b), FIG. 11 and FIG. 12, all of the light-emitting devices 20 in the display device 2 may be controlled to emit light, alternatively, a part of the light-emitting devices 20 may be controlled to emit light. Illustratively, the light-emitting devices 20 for emitting a same primary colored light in all of the light-emitting devices 20 are controlled to emit light. For example, the light-emitting devices 20 for emitting blue light in all of the light-emitting devices 20 are controlled to emit light.

In some embodiments, as shown in FIG. 1(a)~FIG. 2(b), FIG. 11 and FIG. 12, the lights shielded by the light-shielding layer 30 among the lights emitted by the light-emitting devices 20 irradiate to the to-be-recognized body REC, and pass through the imaging holes 301 of the light-shielding layer 30 after being reflected by the to-be-recognized body REC, so that the to-be-recognized body REC can be imaged on the pattern recognition layer 40 to ensure that the sensor units 410 included in the pattern recognition layer 40 may perform pattern recognition according to the electrical signal converted from the detected light signal.

In some embodiments, as shown in FIG. 1(a)~FIG. 2(b), FIG. 11 and FIG. 12, the light-shielding layer 30 is configured to shield blue light and green light; the S100 comprises:

Controlling the light-emitting device 20 configured to emit green light to emit light and/or controlling the light-emitting device 20 configured to emit blue light to emit light.

Illustratively, it is available to only control the light-emitting devices 20 configured to emit green light to emit light and the light-emitting devices 20 configured to emit other primary colored lights not to emit light. Also, it is available to only control the light-emitting devices 20 configured to emit blue light to emit light and the light-emitting devices 20 configured to emit other primary colored lights not to emit light. Of course, it is also available to control the light-emitting devices 20 configured to emit blue light and light-emitting devices 20 configured to emit green light to emit light and the light-emitting devices 20 configured to emit other primary colored lights not to emit light.

In some embodiments, as shown in FIG. 1(a)~FIG. 2(b), FIG. 11 and FIG. 12, the display device 2 provided in some embodiments of the present disclosure can perform both display and pattern recognition. The time for pattern recognition is short, thus only controlling partial light-emitting devices 20 to emit light would not affect normal display of the display device 2 during pattern recognition. Since the light-emitting devices 20 configured to emit green light and/or the light-emitting devices 20 configured to emit blue light are controlled to emit light and the light-shielding layer 30 is configured to shield blue light and green light during pattern recognition, the lights emitted by the light-emitting devices 20 can only irradiate to the pattern recognition layer 40 through the imaging holes 301 on the light-shielding layer 30 after irradiating to and being reflected by the to-be-recognized body REC. Accordingly, the lights are prevented from irradiating to the pattern recognition layer 40 through a portion of the light-shielding layer 30 other than the imaging holes 301, thereby eliminating the stray lights on the pattern recognition layer 40, and ensuring that the pattern of the to-be-recognized body REC is clear, which is advantageous to the accuracy of pattern recognition.

The above embodiments are merely specific embodiments of the present disclosure, but the protection scope of the present disclosure is not limited thereto. For those skilled in the art, various changes and modifications can be made therein without departing from the spirit and essence of the disclosure, which are also considered to be within the protection scope of the disclosure. Therefore, the protection scope of the present disclosure should be determined by the protection scope of the claims.

The invention claimed is:

1. An array substrate, comprising a pattern recognition layer, a light-shielding layer and a plurality of light-emitting devices, wherein, the light-shielding layer and the plurality of light-emitting devices are stacked on a base substrate along a direction away from the base substrate; the pattern recognition layer is disposed on a side of the light-shielding layer away from the plurality of light-emitting devices; the light-shielding layer is configured to shield at least one of multi-primary colored lights emitted by the light-emitting devices; the light-shielding layer has a plurality of imaging holes located in a display area, and orthographic projections of the plurality of imaging holes and the plurality of light-emitting devices on a plate surface of the base substrate are independent from each other;

the pattern recognition layer comprises a plurality of sensor units that are in one-to-one correspondence with the plurality of imaging holes, and the orthographic projections of the plurality of imaging holes on the plate surface of the base substrate are located in the orthographic projections of the plurality of sensor units on the plate surface of the base substrate in a one-to-one correspondence manner, wherein the material of the light-shielding layer is an organic material with an optical density value in the range from 2.0 to 10.0, and a thickness of the light-shielding layer is from 3 μm to 4 μm.

2. The array substrate according to claim 1, further comprising:

the light-shielding layer comprises a planarization layer disposed between the base substrate and the plurality of light-emitting devices, or the light-shielding layer comprises a pixel defining layer comprising a plurality of pixel openings in one-to-one correspondence with the plurality of light-emitting devices, and the plurality of light-emitting devices are disposed in the plurality of pixel openings in a one-to-one correspondence manner, or the light-shielding layer comprises a planarization layer and a pixel defining layer stacked together, and the planarization layer is located between the pixel defining layer and the base substrate.

3. The array substrate according to claim 1, wherein the light-shielding layer is configured to shield visible light.

4. The array substrate according to claim 1, wherein the material of the light-shielding layer comprises polyimide and a light-absorbing substance doped into the polyimide, and the light-shielding layer is configured to shield blue light and green light.

5. The array substrate according to claim 4, wherein, a mass ratio of the light-absorbing substance to the polyimide is (10~45): (55~90).

6. The array substrate according to claim 4, further comprising a green light filter or a blue light filter, wherein the green light filter or the blue light filter is disposed between the light-shielding layer and the pattern recognition layer.

7. The array substrate according to claim 1, wherein the plurality of imaging holes are distributed evenly in the whole display area; or the display area comprises a pattern recognition portion, and the plurality of imaging holes are distributed evenly in a region of the light-shielding layer corresponding to the pattern recognition portion.

8. The array substrate according to claim 1, wherein each of the plurality of imaging holes is a circular hole.

9. The array substrate according to claim 8, wherein each of the plurality of imaging holes has a diameter from 5 μm to 10 μm.

10. A display device, comprising the array substrate according to claim 1.

11. A pattern recognition method, applied to the display device according to claim 10, comprising: controlling the light-emitting devices to emit light; performing pattern recognition according to an electrical signal converted from a light signal detected by the sensor units, wherein the light-shielding layer of the array substrate included in the display device is configured to shield blue light and/or green light; controlling the light-emitting devices to emit light comprises: controlling the light-emitting device configured to emit green light to emit light and/or controlling the light-emitting device configured to emit blue light to emit light.

* * * * *